United States Patent
Kim

(10) Patent No.: US 7,074,679 B2
(45) Date of Patent: Jul. 11, 2006

(54) METHODS OF FABRICATING SELF-ALIGNED SOURCE OF FLASH MEMORY DEVICE

(75) Inventor: In Su Kim, Gyeonggi-do (KR)

(73) Assignee: Donghu Electronics, Co., Ltd., Seoul (KR)

( * ) Notice: Subject to any disclaimer, the term of this patent is extended or adjusted under 35 U.S.C. 154(b) by 104 days.

(21) Appl. No.: 10/758,188

(22) Filed: Jan. 15, 2004

(65) Prior Publication Data

US 2005/0070067 A1    Mar. 31, 2005

(30) Foreign Application Priority Data

Sep. 25, 2003   (KR) ..................... 10-2003-0066582

(51) Int. Cl.
*H01L 21/336* (2006.01)

(52) U.S. Cl. ................ 438/279; 438/706; 257/E21.214

(58) Field of Classification Search ................ 438/257, 438/279, 706; 257/E21.214
See application file for complete search history.

(56) References Cited

U.S. PATENT DOCUMENTS

| | | | |
|---|---|---|---|
| 4,113,533 A | * | 9/1978 | Okumura et al. ........... 438/301 |
| 5,552,331 A | | 9/1996 | Hsu et al. ...................... 437/40 |
| 5,955,759 A | | 9/1999 | Ismail et al. ................. 257/332 |
| 6,001,687 A | | 12/1999 | Chu et al. .................... 438/257 |
| 6,337,262 B1 | | 1/2002 | Pradeep et al. ............. 438/574 |
| 6,784,061 B1 | * | 8/2004 | Yang et al. .................. 438/279 |
| 2002/0055228 A1 | * | 5/2002 | Ambrose et al. ........... 438/257 |

FOREIGN PATENT DOCUMENTS

| | | | |
|---|---|---|---|
| KR | 1020010104910 | | 11/2001 |
| KR | 1020030049450 | | 6/2003 |
| KR | 2003094442 | * | 12/2003 |

* cited by examiner

*Primary Examiner*—Bradley K. Smith
(74) *Attorney, Agent, or Firm*—Saliwanchik, Lloyd & Saliwanchik

(57) ABSTRACT

Example methods of fabricating semiconductor devices are disclosed. One example method may include depositing an oxide layer, a first conducting layer for a floating gate, a dielectric layer, and a second conducting layer for a control gate in sequence on a semiconductor substrate including a device isolation layer; forming gates by removing some parts of the oxide layer, the first conducting layer, the dielectric layer, and the second conducting layer; forming a mask pattern for a self-aligned source over the substrate including the gates; removing the device isolation layer exposed between the gates; performing an ion implantation process; and eliminating damage generated during the ion implantation process or the removal of the device isolation layer.

10 Claims, 3 Drawing Sheets

Fig. 1a –PRIOR ART–
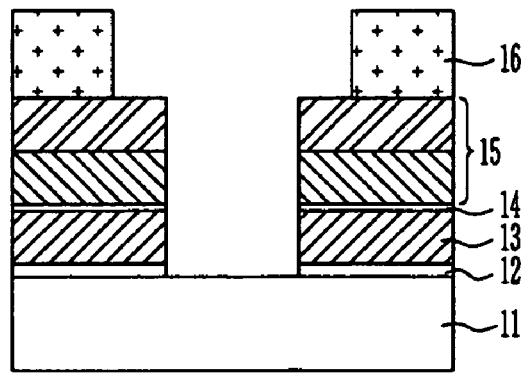
Fig. 1b –PRIOR ART–
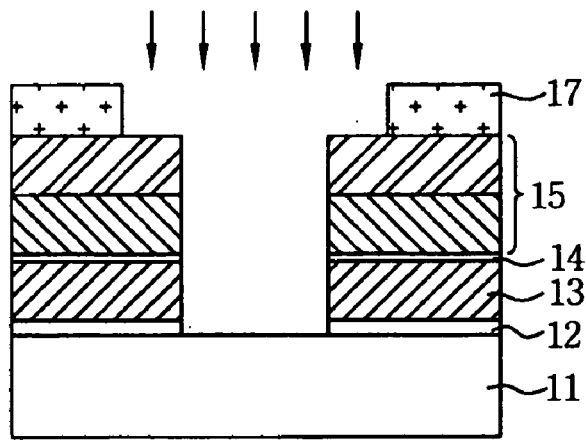
Fig. 1c –PRIOR ART–
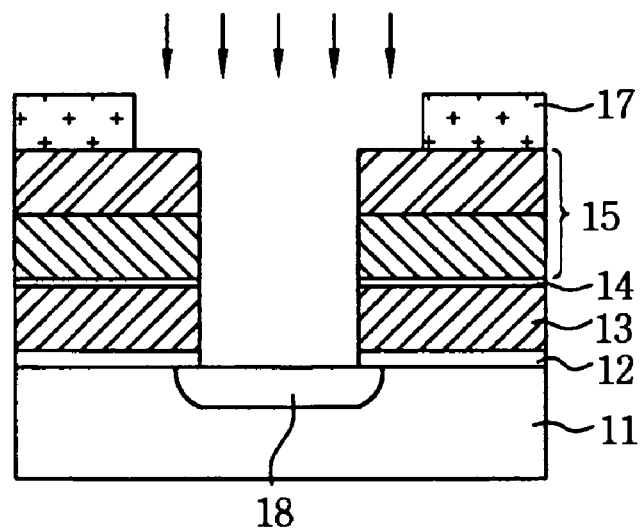

METHODS OF FABRICATING SELF-ALIGNED SOURCE OF FLASH MEMORY DEVICE

TECHNICAL FIELD

The present disclosure relates to semiconductor devices and, more particularly, to methods of fabricating semiconductor devices.

BACKGROUND

Generally, a flash memory device includes a source connection layer that connects the sources of unit cells to form a source line. As a conventional method for forming the source connection layer, a metal contact method includes forming a contact in the sources of unit cell(s) and connecting the contacts. However, this method is inappropriate for highly integrated devices because a contact margin needs to be provided. To implement the high-integration of a device, recently, a source line of an impurity diffusion layer has been employed. The source line of an impurity diffusion layer is formed by means of a self-aligned source (SAS) process.

For example, Korean Publication Patent No. 2003-49450 discloses a method for smoothly applying a cell source ion implantation process by compensating damage of a photoresist pattern for the formation of a source line using a SAS etching process. Korean Publication Patent No. 2001-104910 provides a method for preventing the substrate silicon of active regions from being damaged by etching a field oxide layer after the formation of a polysilicon layer for a floating gate.

As other examples, U.S. Pat. No. 5,955,759 to Ismail et al. discloses a method for making a field effect transistor. The method by the Ismail et al. patent comprises forming raised source/drain contacts self-aligned to preexisting junction regions and then forming the gate dielectric and a self-aligned metal or metal/polysilicon gate which may be T-shaped in order to reduce the parasitic gate resistance. U.S. Pat. No. 5,552,331 to Hsu et al. discloses a method for forming spacers with different width along with a gate to protect gate-edges and adjacent source regions during an etching process for the formation of a self-aligned source.

FIGS. 1a through 1c illustrate, in cross-sectional views, the process of forming a source line of a flash memory device according to a conventional method.

Referring to FIG. 1a, a device isolation layer (not shown) is formed on a semiconductor substrate 11. The device isolation layer defines a field region and an active region. A tunnel oxide layer 12 is formed in the active region of the substrate 11. A stack gate structure is formed on the tunnel oxide layer 12. The stack gate structure comprises a floating gate 13, a dielectric layer 14, and a control gate 15. To reduce word line resistance according to high-integration of device, the control gate 15 generally has a multi-layer structure comprising a polysilicon and a metal material selected from a group consisting of WSix, W, CoSix, TiSix, etc. Next, a photoresist pattern 16 is formed over the stack gate structure. The photoresist pattern is formed by means of a SAS mask process and defines a source line region.

Referring to FIG. 1b, a device isolation layer (not shown) in the source line region is removed by means of a SAS etching process. As a result, the semiconductor substrate 11 in the source line region is completely exposed. After the completion of the SAS etching process, a baking process is performed. Through the SAS etching and the baking processes, the photoresist pattern 16 becomes thin and hardened.

Referring to FIG. 1c, a cell source ion implantation process is performed using the thin and hardened photoresist pattern 17 as a mask. As a result, a source line 18 in which impurity ions are implanted is formed in the source line region of the semiconductor substrate 11.

However, such conventional technology may cause defects in silicon lattices due to the etching and the ion implantation for the formation of source and drain and, therefore, the thickness of the oxide layer on either side of the gate may not become uniform.

BRIEF DESCRIPTION OF THE DRAWINGS

FIGS. 1a through 1c illustrate, in cross-sectional views, the process of forming a source line of a flash memory device according to a conventional method.

DETAILED DESCRIPTION

Figure 2A:
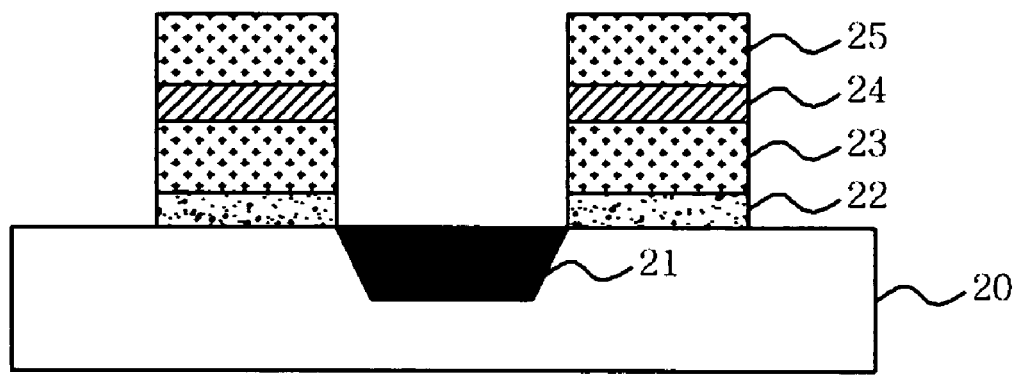
FIGS. 2a through 2d illustrate, in cross-sectional views, the results of an example disclosed semiconductor fabricating process.

Referring to FIG. 2a, an oxide layer 22 is formed on a substrate including a device isolation layer 21. A first conducting layer 23 for a floating gate, a dielectric layer 24, and a second conducting layer 25 for a control gate are formed in sequence over the oxide layer 22. Some part of the first conducting layer 23, the dielectric layer 24, and the second conducting layer 25 are removed to form the floating and control gates.

Here, the oxide layer 22 has an appropriate thickness to ensure the characteristics of a transistor required for a cell array region or a peripheral circuit region. The thickness of the oxide layer 22 may vary depending on whether the peripheral region is a high-voltage region or a low-voltage region. The first conducting layer 23 for the floating gate may be formed of polysilicon. The polysilicon may be undoped or doped polysilicon. The doped polysilicon may be formed by the process of depositing a polysilicon layer and, then, implanting ions such as As or P or doping P through a $POCl_3$ process. The dielectric layer 24 is an insulating layer with a high dielectric constant and a high breakdown voltage. The dielectric layer 24 may be an oxide-nitride-oxide (ONO) layer. The second conducting layer 25 may be a doped polysilicon layer.

In another example, a metal material may be deposited on the second conducting layer 25 for the control gate to form a silicide layer on the control gate. This is to reduce word line resistance according to the high-integration of a device.

Figure 2B:
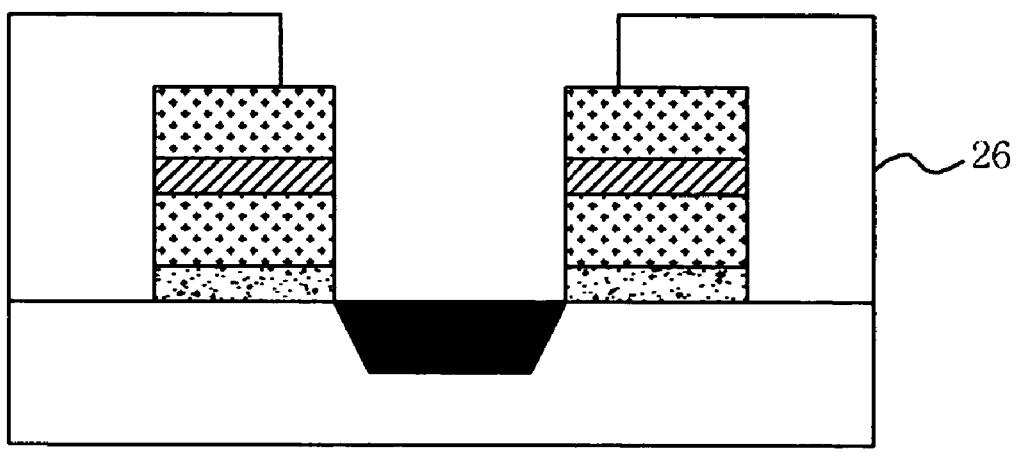

Referring to FIG. 2b, a mask pattern 26 for the formation of a self-aligned source (SAS) is formed over the substrate including the gates.

Figure 2C:
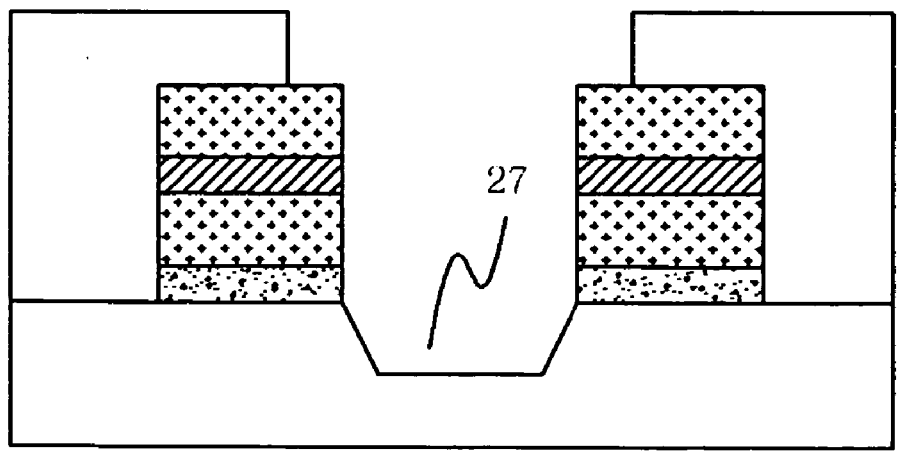

Referring to FIG. 2c, after the formation of the mask pattern 26, an SAS etching process is performed to remove the device isolation layer exposed in a source line region between the gates. As a result, the surface of the substrate 11 in the source line region is completely exposed. The device isolation layer is preferably removed by means of a dry etching process employing a top power between 800 W and 1500 W and a bottom power between 800 W and 1300 W under a pressure between 100 mTorr and 130 mTorr. Here, the used etching gases are $C_4F_8$ between 3 standard cubic centimeter per minute (sccm) and 5 sccm, CHF3 between 2 sccm and 6 sccm, O2 between 1 sccm and 5 sccm, and Ar between 100 sccm and 300 sccm.

Figure 2D:
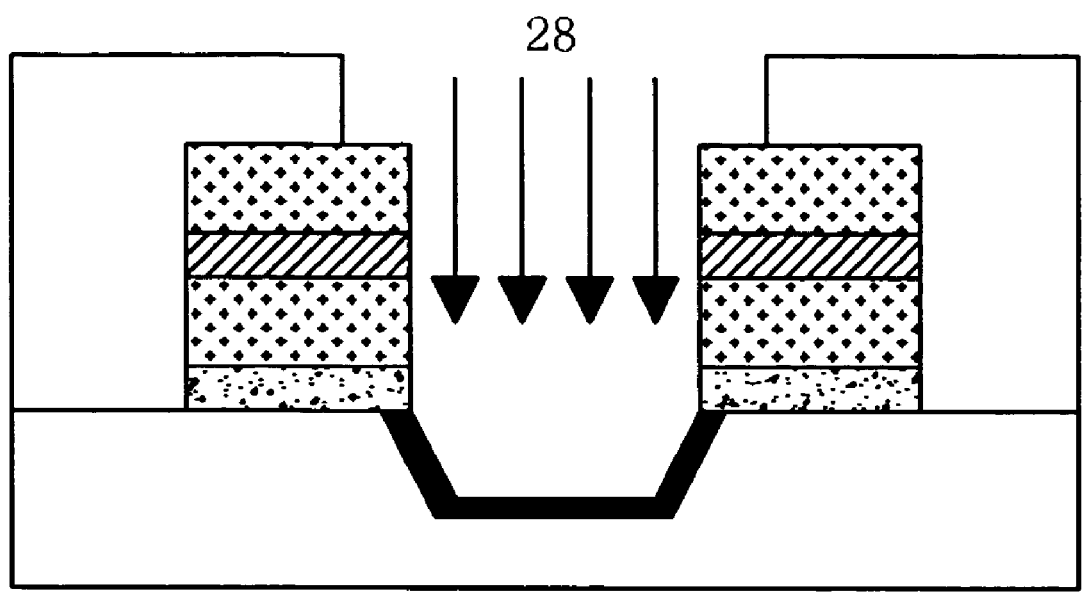

Referring to FIG. 2d, after the SAS etching process, an ion implantation process 28 is performed using the mask pattern 26 as an etching mask. As a result, a source line in which ions are implanted is formed in the semiconductor substrate.

However, during the removal process of the device isolation layer, the dry etching employs plasma and, therefore, both sides of the gate may be damaged by ions in the plasma. In addition, during the ion implantation, both sides of the gate may be damaged by ions. To remove such damaged parts, a chemical dry etching process is performed after the ion implantation process. By employing remote plasma, the chemical dry etching prevents ions from entering into a reaction chamber and allows reaction only by radicals. Through the chemical dry etching, the damaged parts formed during the etching of the substrate can be removed and, therefore, the characteristics of an insulating layer in the following process can be enhanced.

The chemical dry etching may be an isotropic etching. According to one example, the chemical dry etching is performed by applying microwave power between 300 W and 500 W under a pressure between 200 mTorr and 250 mTorr. Here, the used etching gases are $CF_4$ between 200 sccm and 280 sccm and $O_2$ between 40 sccm and 80 sccm. In one example, the chemical dry etching is performed by applying microwave power of 400 w under a pressure of 225 mTorr. Here, $CF_4$ of 240 sccm and $O_2$ of 60 sccm are used as etching gases.

The chemical dry etching can reduce damage and defects of silicon by eliminating damage by ions, thereby preventing the unordinary growth of an insulating layer in the following process and improving the electrical characteristics of a device.

After the chemical dry etching, a cleaning process is performed to wash the etched substrate and, then, an insulating layer is deposited over the resulting substrate 11. The insulating layer is preferably BPSG (boron phosphorus silicate glass) layer.

The disclosed process removes the damage in silicon lattices due to the etching and the ion implantation processes and enhances the characteristics of an insulating layer by means of the chemical dry etching. Therefore, during the operation of a flash memory device, the loss of electrons can be prevented and the electrical characteristics of a device can be improved.

As disclosed herein, example methods of fabricating a semiconductor device ensure the uniform thickness of an oxide layer and improve electrical characteristics of a device by employing a damage removal etching process to eliminate damage due to an etching and an ion implantation.

One example disclosed method may include depositing an oxide layer, a first conducting layer for floating gate, a dielectric layer, and a second conducting layer for control gate in sequence on a semiconductor substrate including a device isolation layer; forming gates by removing some part of the oxide layer, the first conducting layer, the dielectric layer, and the second conducting layer; and forming a mask pattern for a self-aligned source over the substrate including the gates. The example method may also include removing the device isolation layer exposed between the gates; performing an ion implantation process; and eliminating damage generated during the ion implantation process or the removal process of the device isolation layer.

Although certain methods have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of fabricating a semiconductor device comprising:

depositing an oxide layer, a first conducting layer for a floating gate, a dielectric layer, and a second conducting layer for a control gate in sequence on a semiconductor substrate including a device isolation layer;

forming gates by removing some part of the oxide layer, the first conducting layer, the dielectric layer, and the second conducting layer;

forming a mask pattern for a self-aligned source over the substrate including the gates;

removing the device isolation layer exposed between the gates;

performing an ion implantation process;

eliminating damage generated during the ion implantation process or the removal process of the device isolation layer by means of a chemical dry etching process;

washing the substrate from which the damage has been eliminated through a cleaning process; and forming an insulating layer over the resulted substrate.

2. A method as defined by claim 1, wherein the first aid the second conducting layers are formed of polysilicon.

3. A method as defined by claim 1, wherein the dielectric layer is an oxide-nitride-oxide (ONO) layer.

4. A method as defined by claim 1, wherein the device isolation layer is removed by means of dry etching.

5. A method as defined by claim 4, wherein the dry etching is performed by applying a top power between 800 W and 1500 W under a pressure between 100 mTorr and 300 mTorr.

6. A method as defined by claim 4, wherein the dry etching is performed using $C_4F_8$ between 3 sccm and 5sccm, $CHF_3$ between 2 sccm and 6 sccm, $O_2$ between 1 sccm and 5 sccm, and Ar between 100 sccm and 300 sccm.

7. A method as defined by claim 1, wherein the chemical dry etching process employs remote plasma in order to prevent ions from entering into a reaction chamber and to allow reaction only by radicals.

8. A method as defined by claim 1, wherein the chemical dry etching is an isotropic etching.

9. A method as defined by claim 1, wherein the chemical dry etching is preformed by applying microwave power between 300 W and 500 W under a pressure between 200 mTorr and 250 mTorr.

10. A method as defined by claim 1, wherein the chemical dry etching is performed using $CF_4$ between 200 sccm and 280 sccm and $O_2$ between 40 sccm and 80 sccm.

* * * * *